(12) United States Patent
Trapani et al.

(10) Patent No.: US 6,549,335 B1
(45) Date of Patent: Apr. 15, 2003

(54) HIGH DURABILITY CIRCULAR POLARIZER FOR USE WITH EMISSIVE DISPLAYS

(75) Inventors: Giorgio Trapani, Cambridge, MA (US); Richard Pawlak, Stow, MA (US); Gene R. Carlson, Randolph, MA (US); James N. Gordon, Newton, MA (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 09/627,257

(22) Filed: Jul. 28, 2000

(51) Int. Cl.$^7$ .............................. G02B 5/30; G02B 27/28
(52) U.S. Cl. ...................... 359/490; 359/485; 359/494; 345/32; 345/44; 345/46
(58) Field of Search ................... 359/490, 492, 359/497, 483, 485, 494; 353/20; 362/19; 345/32, 35, 39, 44, 45, 46

(56) References Cited

U.S. PATENT DOCUMENTS

| | | | | |
|---|---|---|---|---|
| 2,445,555 A | * | 7/1948 | Binda .......................... | 359/490 |
| 3,914,017 A | | 10/1975 | Bedell | |
| 4,007,396 A | * | 2/1977 | Wisbey et al. ................ | 257/88 |
| 4,100,455 A | * | 7/1978 | DuBois ....................... | 313/111 |
| 4,747,674 A | * | 5/1988 | Butterfield et al. .......... | 359/490 |
| 4,803,402 A | * | 2/1989 | Raber et al. ................. | 313/509 |
| 4,963,788 A | * | 10/1990 | King et al. .................. | 313/503 |
| 5,015,072 A | * | 5/1991 | Howell ........................ | 359/493 |
| 5,066,108 A | * | 11/1991 | McDonald ................... | 359/497 |
| 5,082,601 A | * | 1/1992 | Okada et al. ................ | 252/585 |
| 5,666,223 A | | 9/1997 | Bennett et al. ............. | 359/490 |
| 5,796,509 A | * | 8/1998 | Doany et al. ................ | 359/254 |

FOREIGN PATENT DOCUMENTS

| | | | |
|---|---|---|---|
| EP | 0 961 138 | | 12/1999 |
| WO | Wo 97/38452 | * | 10/1997 |

OTHER PUBLICATIONS

John J. Cael et al., High Durability KE Polarizers for LCD Applications, Polaroid Corporation, pp. 1–5, copyright 1995, document dated Jul. 26, 2000.
Japanese Abstract—Publication No. 57015236, Jan. 26, 1982.
Japan–US Business Report, No. 333, Jun. 1997, XP–002210699, pp. 1–2, "American Companies in Japan—Precision and Medical Equipment".

* cited by examiner

*Primary Examiner*—John Juba, Jr.
(74) *Attorney, Agent, or Firm*—Stephen W. Buckingham

(57) ABSTRACT

A high durability circular polarizer includes an unprotected K-type polarizer, such as a KE polarizer sheet, and a quarter-wavelength retarder. An optical system using the circular polarizer further includes an emissive display module such as an organic light emitting diode or a plasma display device.

3 Claims, 2 Drawing Sheets

HIGH DURABILITY CIRCULAR POLARIZER FOR USE WITH EMISSIVE DISPLAYS

TECHNICAL FIELD

This invention relates to circular polarizers, and more particularly to high durability circular polarizers for use with emissive displays.

BACKGROUND

Unpolarized ambient light waves vibrate in a large number of directions without a single characterizing electromagnetic radiation vector. By contrast, plane polarized light consists of light waves having a direction of vibration along a single electromagnetic radiation vector. Also, circularly polarized light has a direction of vibration along an electromagnetic radiation vector that rotates as the light propagates through space. Polarized light has many applications in electro-optical devices, such as the use of plane and circular polarizing filters to reduce glare in displays.

Much commercial attention has been directed to the development and improvement of flat panel displays, particularly flat panel displays that are thinner and more compact than displays requiring backlighting for luminescence. Such flat panel displays may use emissive or electroluminescent displays, i.e., self-luminous displays for which no backlight is required.

Polarizers in the form of synthetic polarizing films are desirable for their comparative ease of manufacture and handling and the comparative ease with which they may be incorporated into electro-optical devices such as flat panel displays. In general, plane polarizing films have the property of selectively passing radiation vibrating along a given electromagnetic radiation vector and absorbing electromagnetic radiation vibrating along a second electromagnetic radiation vector based on the anisotropic character of the transmitting film medium. Plane polarizing films include dichroic polarizers, which are absorbing plane polarizers utilizing the vectorial anisotropy of their absorption of incident light waves. The term "dichroism" refers to the property of differential absorption of the components of incident light, depending on the vibration directions of the component light waves. Light entering a dichroic plane polarizing film encounters two different absorption coefficients along transverse planes, one coefficient being high and the other coefficient being low. Light emerging from a dichroic film vibrates predominantly in the plane characterized by the low absorption coefficient.

Dichroic plane polarizing films include iodine, dyestuff and H-type polarizers. An H-type polarizer is a synthetic dichroic sheet polarizer including a polyvinyl alcohol-iodine complex. Such a chemical complex is referred to as a chromophore. The base material of an H-type polarizer is a water-soluble high molecular weight substance, and the resulting film has relatively low moisture and heat resistance and tends to curl, peel or otherwise warp when exposed to ambient atmospheric conditions.

In contrast to H-type polarizers and other synthetic dichroic plane polarizers are K-type polarizers. A K-type polarizer is a synthetic dichroic plane polarizer based on molecularly oriented polyvinyl alcohol (PVA) sheets or films with a balanced concentration of light-absorbing chromophores. A K-type polarizer derives its dichroism from the light absorbing properties of its matrix, not from the light-absorbing properties of dye additives, stains, or suspended crystalline materials. Thus, a K-type polarizer may have both good polarizing efficiency and good heat and moisture resistance.

An improved K-type polarizer, referred to as a KE polarizer, is manufactured by 3M Corp., Norwood, Mass. The KE polarizer has improved polarizer stability under severe environmental conditions, such as high temperatures and high humidity. In contrast to H-type polarizers, in which the light absorption properties are due to the formation of a chromophore between PVA and tri-iodide ion, KE polarizers are made by chemically reacting the PVA by an acid catalyzed, thermal dehydration reaction. The resulting chromophore, referred to as polyvinylene, and the resulting polymer may be viewed as a block copolymer of vinylalcohol and vinylene.

For H-type polarizers, stability is achieved by sandwiching the polarizer between two plastic substrates, such as two layers of cellulose triacetate (CTA), one on each side of the polarizer. However, even in these structures the application of heat, humidity and/or vacuum can adversely affect the properties of the polarizer. By contrast, K-type polarizers such as KE polarizers do not need to be sandwiched between sheets of CTA. The polyvinylene chromophore of the KE polarizer is an extremely stable chemical entity, since the chromophore is intrinsic to the polymer molecule. This chromophore is thermally stable as well as resistant to attack from a wide range of solvents and chemicals.

A K-type polarizer such as a KE polarizer has several advantages over other types of polarizers, e.g., iodine and dyestuff polarizers. K-type polarizers have more durable chromophores, are thinner, and may be designed with variable transmission levels. Most notably, K-type polarizers such as KE polarizers may be used in applications that require high performance under severe environmental conditions, including high temperatures and high humidity, such as 85° C. and 85% relative humidity, for extended periods of time. Under such extreme environmental conditions, the stability of iodine and dyestuff polarizers is greatly reduced, thus limiting their usefulness in applications such as emissive flat panel displays. Due to the inherent chemical stability of K-type polarizers, a wide variety of adhesive formulations, including pressure sensitive adhesives, can be applied directly to K-type polarizers. Further, a single-sided plastic support is adequate to give physical support for K-type polarizers, and since this support can be located outside of the display module, it need not be optically isotropic and lower-cost substrates such as polyethylene terephthalate (PET) are acceptable alternatives. Moreover, the ability to construct single-sided laminates allows the optical structures to be thinner, allowing for additional flexibility in the design and manufacture of flat panel display elements. These advantages of K-type polarizers may be used in optical applications such as flat panel displays.

A circular polarizer may be constructed of a plane polarizer and a quarter-wavelength retarder. A quarter-wavelength retarder shifts the phase of light waves propagating along one plane through the retarder by one-quarter wavelength, but does not shift the phase of light waves propagating through the retarder along a transverse plane. The result of combining light waves that are one-quarter wavelength out of phase and that vibrate along perpendicular planes is circularly polarized light, for which the electromagnetic radiation vector rotates as the combined light waves travel through space.

Circularly polarized light may be described with respect to two distinct polarization states: left-handed (L) and right-handed (R) circularly polarized light. A circular polarizer absorbs light of one of these polarization states and transmits light of the other polarization state. The use of circular polarizers to reduce glare in displays is well known. In particular, light from an emissive display can be selectively transmitted through a circular polarizer, while background ambient light reflected in the display, which causes glare, may be reduced or eliminated.

A typical thin film circular polarizer 10 is shown in FIG. 1. A dichroic plane polarizer 12 such as an iodine polarizer usually has 3 mil cellulose triacetate (CTA) coatings 14, 16 applied to both surfaces of the polarizer prior to laminating the polarizer to a quarter-wavelength retarder 18. The cellulose tri-acetate coatings in this construction protect the dichroic plane polarizer from heat and moisture, which can damage the polarizer.

SUMMARY

In general, in one aspect, the invention features a high durability circular polarizer including an unprotected K-type polarizer and a quarter-wavelength retarder.

Implementations of the invention may also include one or more of the following features. The K-type polarizer may include a KE polarizer sheet. The K-type polarizer and the quarter-wavelength retarder may be thin films.

The K-type polarizer may have a first surface and the quarter-wavelength retarder may have a lower surface, and the circular polarizer may include a first adhesive layer disposed on the first surface of the K-type polarizer to secure the K-type polarizer to the lower surface of the quarter-wavelength retarder. The K-type polarizer may have a second surface, and the circular polarizer may include a support layer disposed on the second surface of the K-type polarizer. The support layer may include polyethylene terephthalate. The quarter-wavelength retarder may have a top surface, and the circular polarizer may include a second adhesive layer disposed on the top surface of the quarter-wavelength retarder for attaching the circular polarizer to a display surface. A removable release liner may be disposed over the second adhesive layer.

In general, in another aspect, the invention features a high durability circular polarizer including a K-type polarizer lacking a protective coating thereon and a quarter-wavelength retarder.

In general, in another aspect, the invention features an optical system, including an emissive display module and a circular polarizer including an unprotected K-type polarizer and a quarter-wavelength retarder.

Implementations of the invention may also include one or more of the following features. The emissive display may be an organic light emitting diode or a plasma display device. The circular polarizer may absorb ambient light to decrease interference of the ambient light with a light signal emitted by the display module.

An advantage of the present invention is that a high durability circular polarizer may be constructed that will be stable in severe environmental conditions such as high temperatures and high humidity. A further advantage of the present invention is that an emissive display may be constructed with such a high durability circular polarizer.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
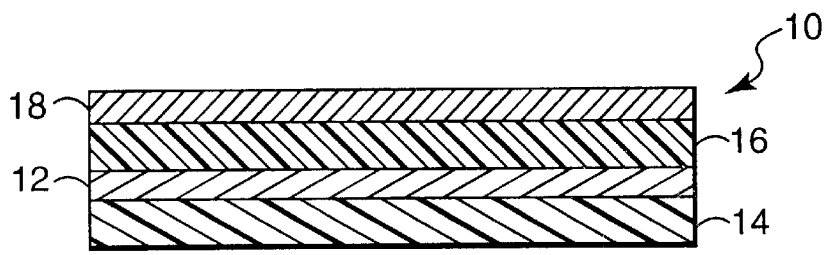
FIG. 1 is a cross sectional view of a prior thin film circular polarizer including a dichroic plane polarizer.
Figure 2:
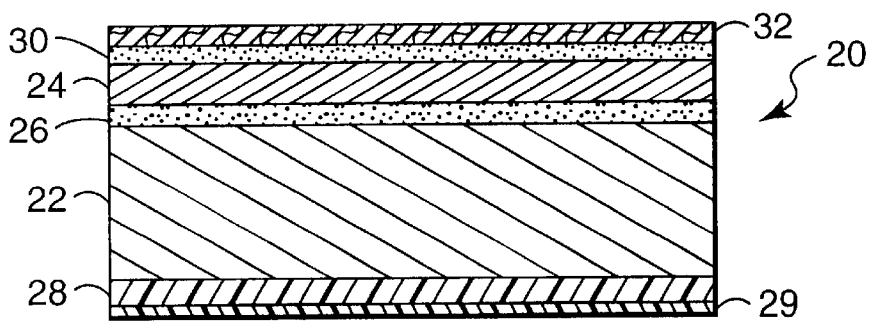
FIG. 2 is a cross sectional view of a high durability circular polarizer according to the present invention.

FIG. 2 shows a high durability circular polarizer 20 as used in the present invention. Circular polarizer 20 includes a K-type polarizer 22 and a quarter-wavelength retarder 24. The K-type polarizer is preferably a KE polarizer sheet of the type manufactured by 3M Corp., Norwood, Mass. The quarter-wavelength retarder is preferably a thin film, broadband quarter-wavelength retarder effective over all or a substantial portion of the visible electromagnetic spectrum, such as the broadband quarter-wavelength retarders manufactured by Teijin.

The K-type polarizer may include a coated adhesive layer 26 on one surface, i.e., the top surface, of the polarizer to secure the polarizer to the quarter-wavelength retarder. The K-type polarizer may also include a PET support layer 28 on its other surface, i.e., the bottom surface, the PET layer preferably having a thickness of 1 mil. PET support layer 28 may also have an antireflective film or coating 29 disposed thereon. It is also possible to construct a K-type polarizer without a supporting substrate layer.

As set forth above, K-type polarizer 22 may be secured to one surface, i.e., the bottom surface, of quarter-wavelength retarder 24 by coated adhesive layer 26. The other surface, i.e., the top surface, of the quarter-wavelength retarder may also be coated with a second layer of adhesive 30 for attaching the composite circular polarizer 20 to a display surface such as glass. The second layer of adhesive may be covered by a removable release liner 32 prior to attaching the circular polarizer to the display surface.

Figure 3:
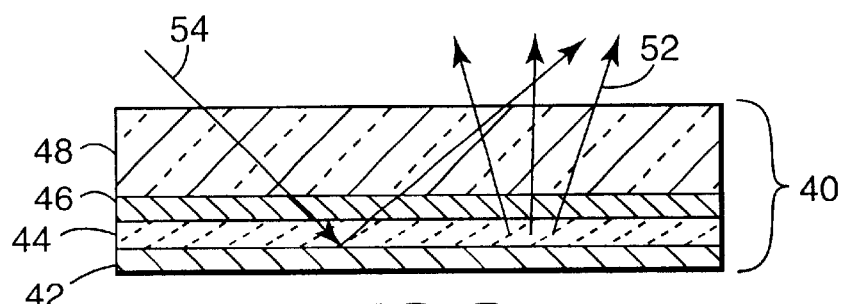
FIG. 3 is a cross sectional view of an OLED emissive display module without a circular polarizer.
Figure 4:
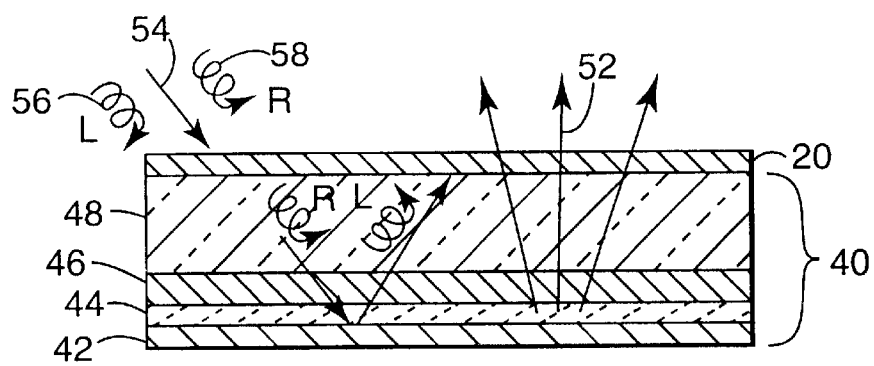
FIG. 4 is a cross sectional view of an OLED emissive display module with a circular polarizer according to the present invention.

High durability circular polarizer 20 may be used in an emissive display module, such as an organic light emitting diode (OLED). As shown in FIGS. 3 and 4, a typical OLED display 40 includes a metallic cathode material layer 42, organic layers 44, a transparent anode conductive material layer 46, and a display surface 48. Cathode material layer 42 may be made, e.g., of aluminum. Anode material layer 46 may be made, e.g., of indium tin oxide. Display surface 48 may be made, e.g., of glass. Organic layers 44, which are disposed between cathode material layer 42 and anode material layer 46 include a hole-injection layer, a hole-transport layer, an emissive layer, and an electron-transport layer. When a voltage, e.g., on the order of a few volts, is applied across the anode and cathode layers, injected positive and negative charges in the hole-transport layer and the electron-transport layer recombine in the emissive layer to produce light, i.e., electroluminescence. The construction of OLEDs is well known in the field of flat panel displays.

In OLED display 40, a cathode material layer 42 including aluminum is highly reflective, and the reflection of ambient light in the OLED display may interfere with the light signal 52 emitted by the OLED display which is to be viewed. FIG. 3 shows how ambient light 54 is reflected from a highly reflective cathode material layer 42 to interfere with the light of emitted signal 52. Under high ambient illumination, the reflectance of ambient light in the OLED display is sufficiently high to compete with the brightness of the emitted signal and thus deteriorates the viewing contrast of an image formed by the emitted signal.

The combination of high durability circular polarizer 20 with an emissive display such as OLED display 40 significantly reduces the intensity of undesirable reflected ambient light, thereby increasing the contrast of the image formed by the emitted signal from the OLED display. As shown in FIG. 4, unpolarized ambient light 54 may be represented as a combination of left-handed (L) 56 and right-handed (R) 58 circularly polarized light components. When unpolarized ambient light 54 enters OLED display 40, one circularly polarized component of the ambient light, e.g., left-handed circularly polarized light 56, is absorbed by circular polarizer 20, while the other component, the right-handed circularly polarized light 58, is transmitted into the OLED display. The transmitted right-handed circularly polarized light is specularly reflected from the reflective cathode material layer in the OLED display. However, the handedness of circularly polarized light is reversed upon specular reflection, and the transmitted right-handed circularly polarized light 58 becomes left-handed circularly polarized light. The reflected left-handed circularly polarized light is reflected toward circular polarizer 20, where it is absorbed in the same manner as the left-handed circularly polarized component 56 of the ambient light. Thus, both the left-handed and right-handed circularly polarized components of the ambient light are absorbed by circular polarizer 20 during transmission through and reflection in OLED display 40 so that they do not interfere with emitted light signal 52.

Additionally, in the case of a full color light emitting diode, a color filter component may be disposed on the quarter-wavelength retarder by any one of a number of methods, such as printing, micro-lithography and laser deposition. The color filter may be monochromatic or multicolored, in which case color filters may be placed in one or more locations on or within the circular polarizer.

Figure 5:
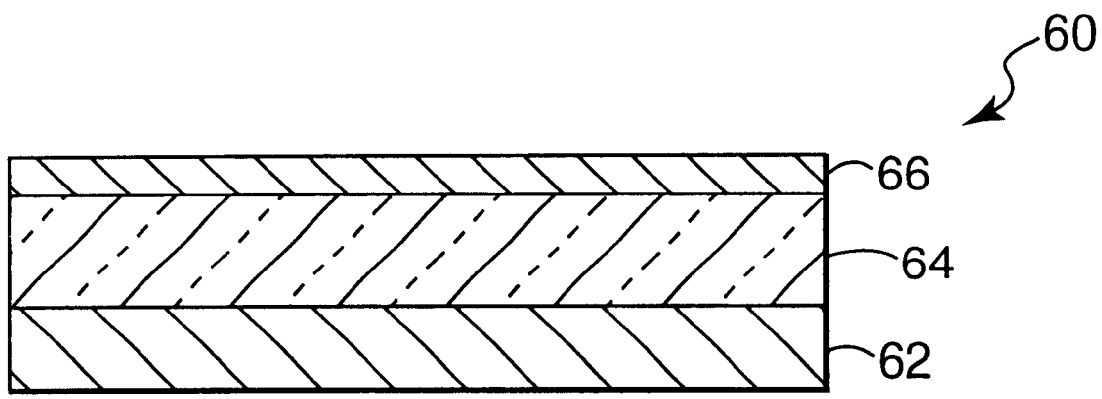
FIG. 5 is a cross sectional view of a plasma display device emissive display module with a circular polarizer according to the present invention.

A plasma display panel is another type of emissive display module that may be combined with a high durability circular polarizer for viewing enhancement. FIG. 5 shows an emissive display module 60 including a plasma display device 62, a display surface 64 and a high durability circular polarizer 66. In a typical gas plasma display panel, each individual pixel or picture element of the display includes three small bulbs that produce light of different colors. The bulbs produce light by running a high-voltage electric current through a gas to convert the gas into the plasma state of matter, which emits light. A circular polarizer used with a plasma display panel must be durable to withstand the operating temperatures of a plasma display panel, which are higher than normal room temperatures. Circular polarizers that include K-type plane polarizers such as KE polarizers are ideally suited to be used in such plasma display panels.

An additional application of the high durability circular polarizer of the present invention is in roll-to-roll construction of optical films, e.g., for use in displays. Such a roll-to-roll assembly process requires that appropriate angles be maintained between the transmission plane of the dichroic K-type plane polarizer and the plane of the quarter-wavelength retarder which shifts the phase of light waves by one-quarter wavelength, to ensure that the combination functions efficiently as a circular polarizer. Without maintaining the appropriate angles between the plane polarizer and the quarter-wavelength retarder, such a circular polarizer could not be assembled using a roll-to-roll process, and individual plane polarizers and quarter-wavelength retarders would have to be aligned manually.

A number of embodiments of the invention have been described. Nevertheless, it will be understood that various modifications may be made without departing from the spirit and scope of the invention. For example, the high durability circular polarizer of the present invention may be used with any type of emissive display module, including configurations of OLEDs other than those disclosed herein. Accordingly, other embodiments are within the scope of the following claims.

What is claimed is:

1. An optical system, comprising:

an organic light emitting diode having a reflective layer for reflecting ambient light; and a circular polarizer disposed adjacent to the organic light emitting diode, the circular polarizer comprising an unprotected K-type polarizer based on sheets or films of polyvinyl alcohol with a balanced concentration of light-absorbing chromophores, and an unsupported quarter-wavelength retarder, wherein the circular polarizer absorbs the ambient light reflected from the reflective layer of the organic light emitting diode.

2. The optical system according to claim 1 wherein the K-type polarizer comprises a KE polarizer sheet.

3. The optical system according to claim 1 wherein the K-type polarizer and the quarter-wavelength retarder are films.

* * * * *

UNITED STATES PATENT AND TRADEMARK OFFICE
CERTIFICATE OF CORRECTION

PATENT NO. : 6,549,335 B1
DATED : April 15, 2003
INVENTOR(S) : Trapani, Giorgio B.

It is certified that error appears in the above-identified patent and that said Letters Patent is hereby corrected as shown below:

<u>Column 6,</u>
Line 49, insert after "retarder are" -- thin --

Signed and Sealed this

Third Day of May, 2005

JON W. DUDAS
*Director of the United States Patent and Trademark Office*